(12) United States Patent
Mohanaveeramani et al.

(10) Patent No.: US 10,164,553 B2
(45) Date of Patent: Dec. 25, 2018

(54) METHOD AND DEVICE FOR DAMPING VOLTAGE HARMONICS IN A MULTILEVEL POWER CONVERTER

(71) Applicant: ABB SCHWEIZ AG, Baden (CH)

(72) Inventors: Aravind Mohanaveeramani, Chennai (IN); Jean-Philippe Hasler, Västerås (SE); Suman Maiti, West Bengal (IN)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 15/555,892

(22) PCT Filed: Apr. 1, 2015

(86) PCT No.: PCT/EP2015/057244
§ 371 (c)(1),
(2) Date: Sep. 5, 2017

(87) PCT Pub. No.: WO2016/155824
PCT Pub. Date: Oct. 6, 2016

(65) Prior Publication Data
US 2018/0054144 A1    Feb. 22, 2018

(51) Int. Cl.
*H02M 1/12* (2006.01)
*H02P 6/18* (2016.01)
*H02J 3/18* (2006.01)
*G01R 31/34* (2006.01)
*H02P 21/14* (2016.01)
(Continued)

(52) U.S. Cl.
CPC ............. *H02P 6/187* (2013.01); *G01R 31/34* (2013.01); *H02J 3/1857* (2013.01); *H02M 1/12* (2013.01); *H02P 21/141* (2013.01); *H02M 1/15* (2013.01); *H02M 7/483* (2013.01); *H02M 2001/0003* (2013.01); *H02M 2001/0025* (2013.01); *H02M 2007/4835* (2013.01); *Y02E 40/26* (2013.01)

(58) Field of Classification Search
CPC ................ H02M 1/12; H02M 2001/0003
USPC ................................................ 307/105
See application file for complete search history.

(56) References Cited

U.S. PATENT DOCUMENTS 4,445,080 A    4/1984  Curtiss
6,088,245 A    7/2000  Ainsworth
(Continued)

FOREIGN PATENT DOCUMENTS

WO         2 725 700 A1    4/2014
WO    WO 2014/154290 A1   10/2014

OTHER PUBLICATIONS

International Preliminary Report on Patentability, issued in PCT/EP2015/057244, dated Apr. 20, 2017.
(Continued)

*Primary Examiner* — Adi Amrany
(74) *Attorney, Agent, or Firm* — Birch, Stewart, Kolasch & Birch, LLP (57) ABSTRACT

A method for reducing lower order harmonics of a power converter includes, for each phase leg of the converter: obtaining a voltage reference for the phase leg; for a present sample, obtaining a flux error of the output voltage of the leg; dividing the first sample flux error by a time period to obtain an average voltage error over said time period; subtracting an obtained processed average voltage error, based on the average voltage error, from the voltage reference to obtain a modified voltage reference for the phase leg; and providing the modified voltage reference to a modulation unit of the converter for controlling the phase leg.

20 Claims, 3 Drawing Sheets

(51) Int. Cl.
   *H02M 1/00* (2006.01)
   *H02M 1/15* (2006.01)
   *H02M 7/483* (2007.01)

(56) References Cited

U.S. PATENT DOCUMENTS 6,586,914 B2   7/2003   Garrigan et al.
8,248,039 B2   8/2012   Cao et al.
8,766,570 B2   7/2014   Geyer et al.

OTHER PUBLICATIONS

International Search Report, issued in PCT/EP2015/057244, dated Dec. 4, 2015.
Kouro et al., "Multicarrier PWM With DC-Link Ripple Feedforward Compensation for Multilevel Inverters", IEEE Transactions on Power Electronics, Jan. 2008, vol. 23, No. 1, pp. 52-59.
Morales et al., "Observer for DC voltages in a cascaded H-bridge multilevel STATCOM", IET Electr. Power Appl., Nov. 2007, vol. 1, No. 6, pp. 879-889.
Odavic et al., "Control of a Multi-Level Active Shunt Power Filter for More Electric Aircraft", 13th European Conference on Power Electronics and Applications, 2009, pp. 1-10.
Wang et al., "Research on the Multilevel STATCOM based on the H-bridge Cascaded", Journal of Networks, Jan. 2014, vol. 9, No. 1, pp. 147-152.
Written Opinion of the International Searching Authority, issued in PCT/EP2015/057244, dated Dec. 4, 2015.
Zang et al., "Comparison and Analysis on Common Modulation Strategies for the Cascaded Multilevel STATCOM", PEDS, 2009, pp. 1439-1442.

METHOD AND DEVICE FOR DAMPING VOLTAGE HARMONICS IN A MULTILEVEL POWER CONVERTER

TECHNICAL FIELD

The present disclosure relates to a method and devices for reducing lower order harmonics of a power converter.

BACKGROUND

A delta connected multilevel converter, e.g. a static synchronous compensator (STATCOM) comprises, for each phase leg, an alternating current (AC) side and a direct current (DC) side. The DC bus voltage of the DC side for any phase leg is the sum of the cell capacitor voltages on that particular phase leg. This DC bus voltage is a fictive bus which does not appear structurally in the converter. The STATCOM contains three legs, each leg between two phases. When measuring the fictive DC bus voltage of the leg between the phases A and B, then all the cell capacitor voltages in that particular leg are added together and that is called the DC bus voltage of the phase leg AB. Similarly, in case of a Y (called wye or star) connected STATCOM, the DC bus voltage is between phase (A, B or C) and neutral (called N or earth). The AC harmonic generation by a multilevel converter depends on the number of cells and switching frequency per cell. For cell switching frequencies above three times the fundamental frequency (which may be e.g. 50 or 60 Hz), the lower order voltage harmonics (typically $3^{rd}$, $5^{th}$, $7^{th}$, $9^{th}$ and $11^{th}$) generated by the converter phase leg is insignificant for multilevel converters with a large number of cells, e.g. above 20, according to the Pulse-width modulation (PWM) theory. This holds true when the cell voltages are fixed (i.e. converter is in no-load). However, when the converter is loaded, even harmonics appear on the DC side of the cell voltages which can be seen through power balance between the AC and DC sides. These even harmonic voltages on the DC side interact with the fundamental modulating reference voltage to generate stray magnitudes (up to 2%) of lower order voltage harmonics on the AC side of the converter. Also, in addition to this, when a lesser pulse number per cell (less than 3.5) is used, then the triangle comparison based modulation scheme will generate lower order harmonics irrespective of the number of cells used (i.e., could be more than 20 cells). This phenomenon could be referred to as lower order voltage harmonics generated due to the modulation scheme.

Though the current controller can correct these low order harmonics, the extent of correction is limited by the bandwidth of the current controller. Hence, there would be specific filter requirements for these harmonics to bring the voltage distortion under customer requirements which in turn would increase the cost of the overall system.

In phase shifted carrier (PSC) based PWM, cell capacitor voltages are balanced by adding or subtracting an in-phase component of the current with the voltage reference. A conventional voltage based sorting algorithm can also be used for balancing of cell capacitor voltages. The converter with PSC based PWM generates lower order harmonics, e.g. $3^{rd}$ and $5^{th}$ order harmonics. Fast Fourier transform (FFT) is performed on the voltage measured across the valves of the converter phase leg excluding the drop across the arm reactor. As mentioned above, it has also been observed that the magnitude of the lower order harmonics is further increased with the reduction of pulse number.

The lower order harmonics generated on the AC side of the converter may be due to the following reasons:
(i) Ripple in the cell capacitor voltages due to the instantaneous power flowing through the cell capacitors.
(ii) Improper volt-second balance due to non-idealities, e.g. variation of reference voltage within the time period of carrier signal (i.e., due to low pulse numbers) and variation of cell capacitor voltages.

The second point becomes more prominent when the converter is subjected to operate at low pulse number, e.g. around a pulse number of 3 or less.

U.S. Pat. No. 8,766,570 discloses a control method for a converter. Switching sequences are calculated either through model predictive direct torque control (MPDTC) or offline calculated optimized pulse patters (OPP) to optimize a certain control function such as switching loss, reduced total harmonic distortion (THD), etc. These switching patterns are calculated for steady state operation. When the switching function is applied in real time, due to the non-linearity in the system and due to transient operation of the converter, the actual flux generated by the converter deviates from the desired flux. Hence a prediction model is used to predict the flux error in the switching horizon, when using the switching sequence. At least one transition time of the switching sequence is changed in an attempt to minimize the predicted flux error. The flux error minimization control method is performed on a three-phase level and its target is to reduce the current THD.

SUMMARY

It is an objective of the present invention to provide an improved control of a multilevel converter in which lower order harmonics on the AC side are dampened.

There are several possible ways to damp these lower order harmonics through control. For instance, an expression based method may be used to reduce lower order harmonics. According to such a method, an expression for the $n^{th}$ order voltage harmonic is derived based on Double Fourier Transform. The reference voltage is modified with this expression, such that the $n^{th}$ order harmonic does not present in the converter voltage. But, due to the complexity of the Double Fourier Transforms, only a simplified expression for the lower order harmonics due to the baseband components may be possible. Hence, the error due to the expression increases as the pulse number is reduced. This is due to the fact that the dominance of the baseband harmonics contributing to lower order harmonics reduces, as compared to the carrier and sideband harmonics, during a low pulse number operation.

Another way may be the use of a mathematical model of the converter (converter topology and modulation function) as an estimator, to predict at least one future state of the harmonic voltage that will be generated by the converter. A low pass filter may then be used on the estimated harmonic voltage to extract the lower order components. This estimated lower order harmonic may be used as a feed forward in the control loop to damp them. The efficiency of damping is proportional to the rate at which the estimator is operated. Also, the amount of programming efforts needed by the estimator may be large. The PSC itself may generate high ($\approx$1-2%) lower order harmonics at low pulse number (PN less than 3.5) which may be reduced by a factor of 5-8 with the estimator based damping.

Thus, the present disclosure aims at showing a control method for a triangle comparison based modulation scheme (e.g. PSC based PWM or any other carrier based PWM) to damp the converter generated lower order harmonics at lower pulse number operations.

Above, it is mentioned that improper volt-second balance may be one of the reasons for generation of lower order harmonics when the converter is operated with PSC based PWM (or any carrier based PWM in general) at low pulse numbers. In accordance with the present invention, emphasis is given to maintain the volt-second balance under non-ideal operating conditions, such that the magnitude of undesired lower order harmonics generated due to the modulation is reduced. To achieve this, a voltage correction term ($\Delta V$) corresponding to flux error from the previous sampling step (e.g. of less than 10 microseconds, μs) is added to the voltage reference in the present sampling step. So, the average voltage error over a sampling interval, e.g. half a carrier cycle, may be reduced. Here, the term half carrier cycle corresponds to half the time period of an effective converter switching time period which is represented by Equation 1:

$$\frac{T_{sw}}{2} = \frac{1}{2*PN*N*f_s} \qquad \text{Equation 1}$$

Where,
$T_{sw}$ is the time period of the effective carrier measured on the converter phase leg level,
PN is the pulse number per converter cell of the phase leg,
N is the number of cells of the phase leg, and
$f_s$ is the fundamental frequency of the voltage reference.

The term, $\Delta V$ is in accordance with the present invention computed from the instantaneous flux error which also includes the flux error from the previous sampling period. Thereby, it is made possible to compensate the average voltage error which was created in the previous sampling period, e.g. half carrier cycle, due to non-idealities, in the following sampling period (e.g. half carrier cycle).

According to an aspect of the present invention, there is provided a method for reducing lower order harmonics of a power converter. The method comprises, for sampling of each phase leg of the converter: Obtaining a voltage reference for the phase leg. For a present sample, obtaining a flux error of the output voltage of the leg. Dividing the present sample flux error by a cycle time period to obtain an average voltage error over said time period. Subtracting an obtained processed average voltage error, based on the average voltage error, from the voltage reference to obtain a modified voltage reference for the phase leg. Providing the modified voltage reference to a modulation unit of the converter for controlling the phase leg. The (cycle) time period discussed herein may e.g. be or be part of the switching cycle time period of the converter.

According to another aspect of the present invention, there is provided a control unit for a phase leg of a power converter. The control unit comprises processor circuitry, and a storage unit storing instructions (e.g. a computer program) executable by said processor circuitry whereby said control unit is operative to obtain a voltage reference for the phase leg. The control unit is also operative to, for a present sample, obtain a flux error of the output voltage of the leg. The control unit is also operative to divide the present sample flux error by a time period to obtain an average voltage error over said time period. The control unit is also operative to subtract an obtained processed average voltage error, based on the average voltage error, from the voltage reference to obtain a modified voltage reference for the phase leg. The control unit is also operative to provide the modified voltage reference to a modulation unit of the converter for controlling the phase leg.

According to another aspect of the present invention, there is provided a computer program product comprising computer-executable components for causing a control unit for a phase leg of a power converter to perform an embodiment of the method of the present disclosure when the computer-executable components are run on processor circuitry comprised in the control unit.

According to another aspect of the present invention, there is provided a computer program for reducing lower order harmonics of a power converter. The computer program comprises computer program code which is able to, when run on processor circuitry of a control unit for a phase leg of the power converter, cause the control unit to obtain a voltage reference for the phase leg. The code is also able to cause the control unit to, for a present sample, obtain a flux error of the output voltage of the leg. The code is also able to cause the control unit to divide the present sample flux error by a time period to obtain an average voltage error over said time period. The code is also able to cause the control unit to subtract an obtained processed average voltage error, based on the average voltage error, from the voltage reference to obtain a modified voltage reference for the phase leg. The code is also able to cause the control unit to provide the modified voltage reference to a modulation unit of the converter for controlling the phase leg.

According to another aspect of the present invention, there is provided a computer program product comprising an embodiment of the computer program of the present disclosure and a computer readable means on which the computer program is stored.

The present invention provides a control method which reduces the lower order harmonics generated by the converter. The control method is implemented on a per phase level. The modulation function (e.g. carrier phase shift based PWM) decides on the switching sequence. Due to the non-idealities present in the converter, the actual flux in the system deviates from the desired flux. The flux error calculated from the previous sampling is used as a feedback to damp the lower order harmonics generated in the present sample.

The Flux error compensation of the present invention has been developed mainly for PWM, especially carrier phase shift PWM. But it may be useful for other modulation techniques as well.

It is to be noted that any feature of any of the aspects may be applied to any other aspect, wherever appropriate. Likewise, any advantage of any of the aspects may apply to any of the other aspects. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

The present disclosure provides a method which reduces the magnitude of lower order harmonics of a Δ-connected chain-link converter (or any converter in general e.g. Y-connected) operated with phase shifted carrier based PWM (or any carrier based modulation). According to this method, the voltage reference is modified in each sampling to reduce the flux error. Herein, the time integral of voltage is defined as flux. The time integral of a difference between actual voltage generated by the converter and the reference voltage is defined as the flux error.

Figure 1:
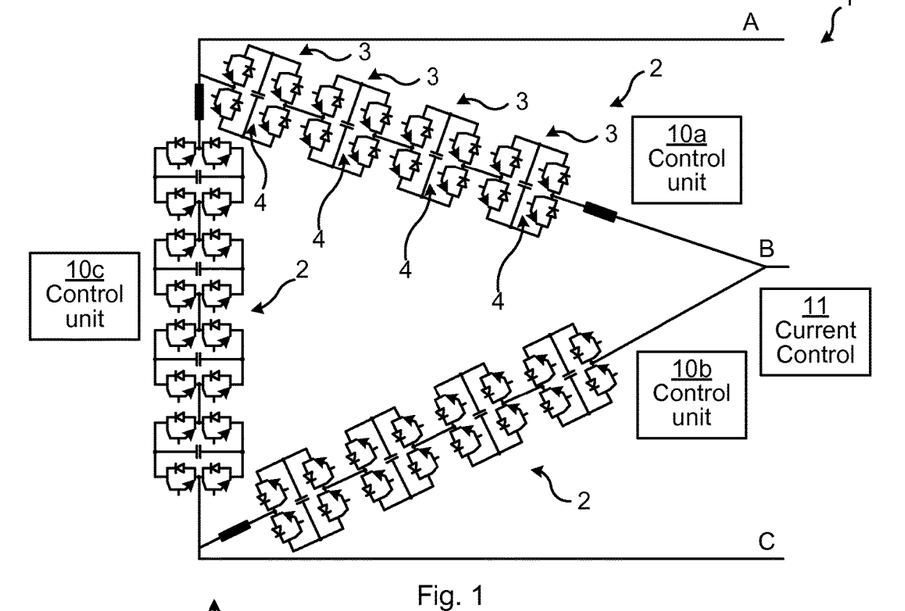
FIG. 1 is a schematic circuit diagram of an embodiment of an AC-AC converter in delta configuration, in accordance with the present invention.

A delta connected chain-link based STATCOM, as shown in FIG. 1 as an example of a power converter in accordance with the present invention, is a voltage source converter (VSC) which can behave like an inductor or capacitor, storing the reactive power in its cell capacitors. This causes lower order harmonics on the AC side of the converter. Also, in addition to this when a lesser pulse number per cell (less than 3.5) is used, then the triangle comparison based modulation scheme may generate lower order harmonics irrespective of the number of cells used (i.e., could be more than 20 cells). As an alternative to a STATCOM, the multilevel converter of the present invention may be a static VAR compensator (SVC).

FIG. 1 schematically illustrates an embodiment of a chain-link converter 1 of the present invention. In the embodiment of FIG. 1, the chain-link converter 1 is in a delta configuration and in a full-bridge configuration. The converter 1 is configured to control and be connected to a three-phase AC system having the phases A, B and C. The converter 1 comprises three phase legs 2, each connected between two of the phases A, B and C. Each of the phase legs 2 comprises a plurality of series-connected converter cells 3. Each cell 3 comprises a capacitor 4. A current control 11 is comprised in the converter 1 in order to control the operation of each of the phase legs 2 of the converter 1, e.g. by setting reference voltages for the phase legs 2. In accordance with the present invention, the converter 1 also comprises a control unit 10 for each phase, here called 10a, 10b and 10c depending on the phase leg 2 it is configured to control. The control units 10 thus perform control on a lower (per phase) level in the converter than the current control 11. Each control unit 10 comprises a processor and a data storage unit, as well as other circuitry which may be appropriate. In accordance with the present invention, the control unit 10 implements a plurality of control functions on its phase leg 2 of the converter 1 for improving the operation of the converter 1 in accordance with the present invention. One or more of the control units 10 may be co-located with each other and/or with the current control 11, and may thus share components e.g. processor circuitry and/or data storage with each other.

Figure 2:
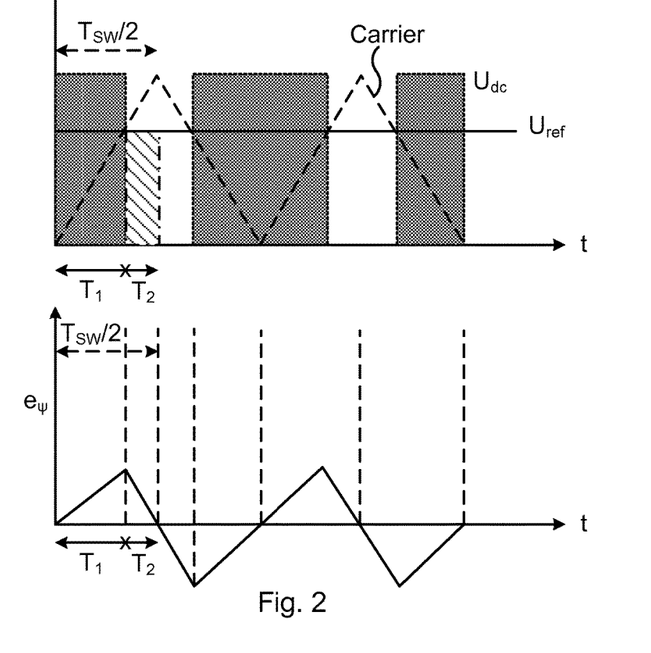
FIG. 2 is a schematic diagram illustrating flux error under ideal conditions, for an embodiment of a converter.

FIG. 2 is a schematic diagram illustrating flux error under ideal conditions, for an embodiment of a converter. The carrier signal ('carrier') per cell 3, reference voltage signal ($U_{ref}$) and the output voltage ($U_{dc}$) of one cell 3 are shown. In any carrier based PWM, the time T1 is calculated according to the volt-second balance in every half cycle of the switching period (i.e. Tsw/2). The volt-second balance during Tsw/2 is expressed in Equation 2.

$$U_{dc}T_1 - U_{ref}T = 0 \quad \text{Equation 2}$$

Here, it is assumed that $U_{ref}$ is constant within the time Tsw/2 and the cell capacitor 4 voltage does not contain any voltage ripple. The flux error can be expressed as:

$$e_\psi = \psi_{act} - \psi_{ref} \quad \text{Equation 3}$$

or:

$$e_\psi = \int_0^{T_1} U_{dc} dt - \int_0^{\frac{T_{sw}}{2}} U_{ref} dt \quad \text{Equation 4}$$

Figure 3:
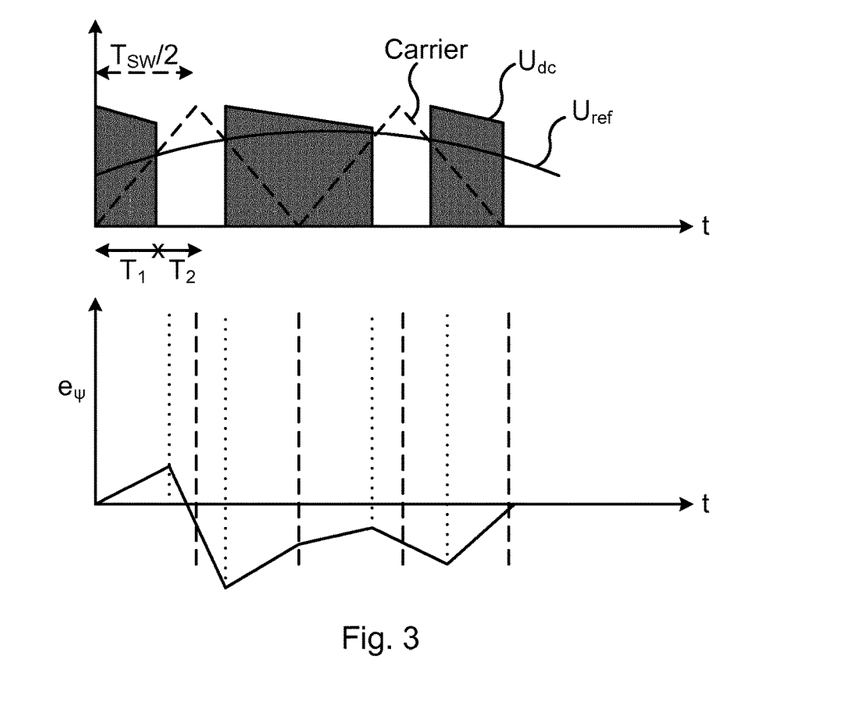
FIG. 3 is a schematic diagram illustrating flux error under non-ideal conditions, for an embodiment of a converter.

The flux error $e_\psi$ is plotted in the bottom half of FIG. 2. It is observed that flux error reaches to zero at the end of each Tsw/2 (at the dashed help lines). But, in a real scenario, the cell capacitor voltage contains ripple or other non-idealities, whereby the reference voltage $U_{ref}$ within the period Tsw/2 may not be constant, as shown in FIG. 3. It is observed that the flux error is not zero at the end of each Tsw/2 period (again, at the dashed help lines). This eventually corresponds to the lower order harmonics in the converter generated voltage.

Figure 4:
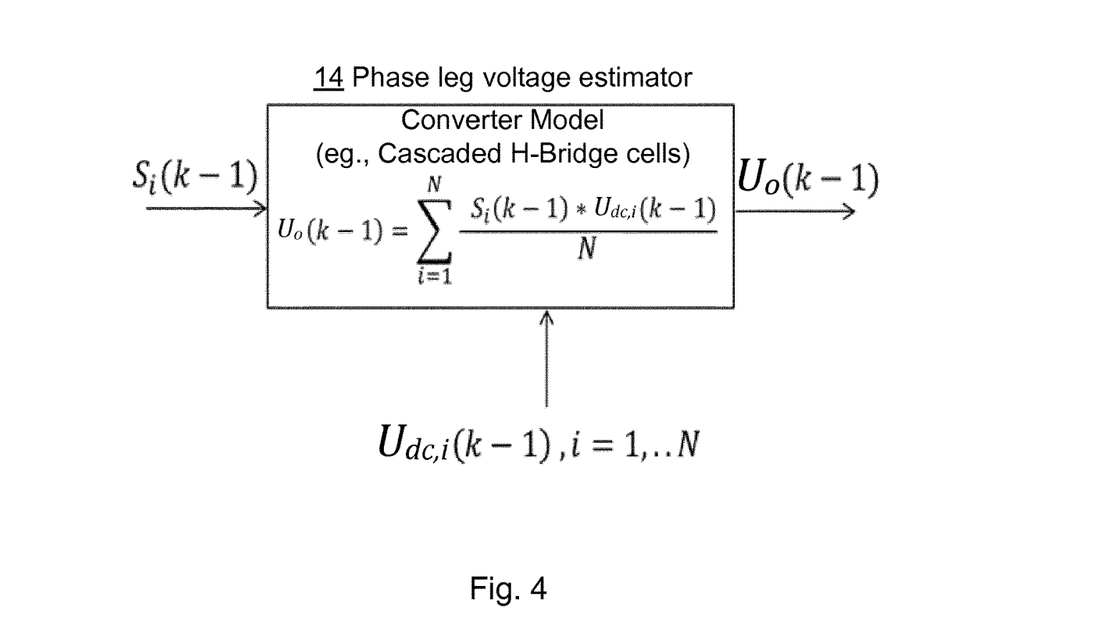
FIG. 4 is a schematic functional block diagram illustrating an embodiment of how to estimate phase leg voltage from individual cell capacitor voltages and switching function (or switching state) of the cells of a phase leg of an embodiment of a converter.

FIG. 4 is a schematic logical block diagram of an embodiment of a mathematical model performed by a phase leg voltage estimator function 14 of the converter 1 for calculating the voltage of a phase leg 2 based on the voltages measured over the capacitors 4 of the cells 3 in the phase leg.

The model depends on at least one switching state of each of the cells, $S_i(k-1)$, which is +1, 0 or −1 depending on whether the cell 3 needs to be inserted in positive mode, bypass mode or negative mode respectively. It also depends on sensing the cell capacitor voltages or the sum of cell capacitor voltages in the phase leg. The voltage output of the converter phase leg, $U_o(k-1)$ is calculated by the expression, $$U_o(k-1) = \sum_{i=1}^{N} \frac{S_i(k-1) * U_{dc,i}(k-1)}{N} \quad \text{Equation 5}$$

or by the expression, $$U_o(K-1) = \sum_{i=1}^{N} \frac{S_i(K-1) * U_{dc,avg}(k-1)}{N} \quad \text{Equation 6}$$

where,
$U_{dc,i}(k-1)$ refers to the previous sample sensed cell capacitor voltages in the phase leg, and
$U_{dc,avg}(k-1)$ is the previous sample average of sensed cell capacitor voltages in the phase leg.

The error in voltage estimation using the latter method may be high. Hence, the former expression is preferred over the latter one. The estimated converter voltage output $U_o(k-1)$ is used as an input in FIG. 5.

Figure 5:
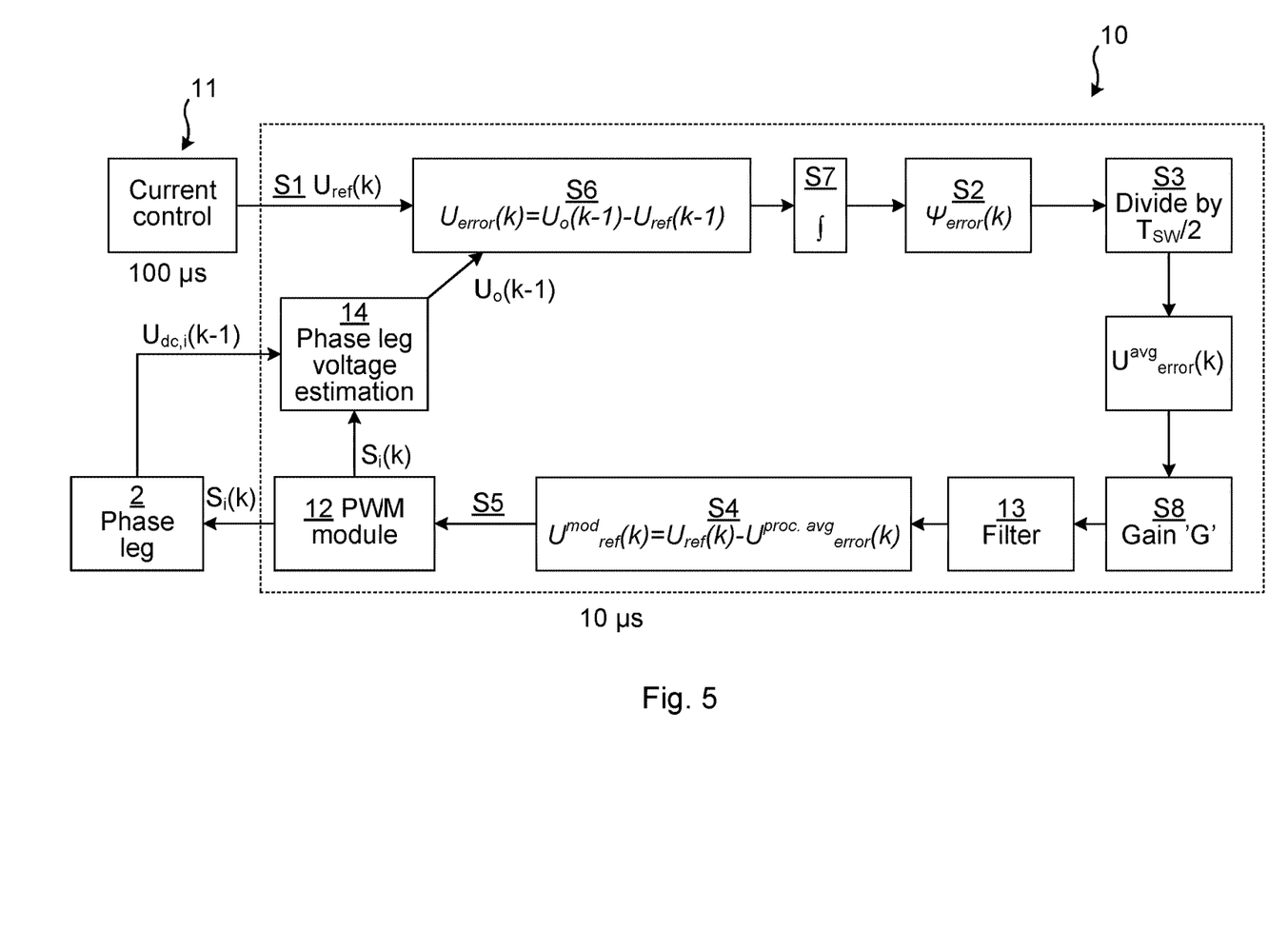
FIG. 5 is a schematic functional flow chart of an embodiment of a method for controlling the flux error in a converter phase leg, in accordance with the present invention.

FIG. 5 is a schematic functional flow chart of an embodiment of a method for controlling the flux error in a converter phase leg. The current control 11 provides the reference voltage $U_{ref}$ for a sampling k of the control unit 10, which is thus obtained S1 by the control unit 10 of each phase leg 2. The current control 11 may e.g. update the voltage reference every 10 μs to 1 s, e.g. every 100 μs as indicated in the figure. The voltage reference may thus be the same for several consecutive samplings k of the control unit if the current control 11 has a longer sampling time than the sampling time of the control unit 10 which may typically have a sampling frequency of 1 10 μs or less.

In an optional step, the control unit 10 may calculate S6 a voltage error $U_{error}$ of the present sample k by subtracting the obtained S1 voltage reference $U_{ref}$ for the phase leg for a preceding sample k-1 from an estimated voltage output $U_o(k-1)$ of the phase leg 2 for said preceding sample (k-1) as discussed above. Then, in another optional step, the control unit 10 may integrate S7 the calculated S6 voltage error $U_{error}$ over the sampling time period used by the control unit 10 (which is typically in the order of 10 μs or less) to obtain the flux error ($\psi_{error}$) of the present sample k. This is an example of how the flux error may be obtained S2 by the control unit 10. Other examples include that the flux error is calculated elsewhere and sent to the control unit 10.

Then, the control unit 10 divides S3 the present sample flux error $\psi_{error}(k)$ by a time period, e.g. $T_{SW}/2$ as discussed herein, to obtain an average voltage error $U^{avg}_{error}$ over said time period. In optional step(s) the average voltage error $U^{avg}_{error}$ may be further processed to obtain a processed average voltage error $Up^{proc.avg}_{error}$. This may e.g. be done by multiplying S8 the average voltage error $U^{avg}_{error}$ by a gain G, and/or by applying a filter 13 to the average voltage error $U^{avg}_{error}$ (possibly as already multiplied by the gain G). The filter 13 may be used to suppress noise generated due to the switching frequency components in the feedback signal. The filter may be a low pass filter or band pass or resonant filter tuned to specific frequency components that needs to be damped. Although $U^{avg}_{error}$ is called "average" voltage error, the waveform typically has DC+Low frequency AC+Switching/High frequency AC quantities. By means of the filter, it may be possible to compensate for the DC and preferable at least some of the low frequency AC quantities. Thus, the filter may be used to either remove the high frequency AC (low pass or band pass filter)–termed as noise due to switching frequency components, or to allow only specific frequency components to pass through the filter, blocking (preferably all) other components (resonant filters). Then, the control unit 10 subtracts S4 the obtained processed average voltage error $U^{proc.avg}_{error}$, based on (and possibly the same as (depending on whether processing has been applied or not)) the average voltage error $U^{avg}_{error}$, from the voltage reference ($U_{ref}$) to obtain a modified voltage reference $U^{mod}_{ref}$ for the phase leg 2. The modified voltage reference $U^{mod}_{ref}$ for the phase leg 2 is then provided S5 to the modulation unit 12 of the converter 1 for controlling the phase leg 2. The modulation unit, e.g. PWM module 12 may generate the switching state, Si(k) of all the cells in the converter phase leg 2. By means of the modulation, e.g. PWM, module, the converter 1 may output a voltage $U_o(k)$. By using the information of previous sample sensed cell capacitor voltages, $\underline{U}_{dc,i}(k-1)$ and the switching state of the cells Si(k-1), $U_o(k-1)$ for calculating the flux error of the present sample k may be computed in the phase leg voltage estimator block 14.

The control unit may be caused to perform the method by means of running a computer program, as presented above. This computer program may be stored in the storage unit of the control unit 10, or be stored on an external medium, to form a computer program product. The computer program product comprises a computer readable (non-volatile) medium comprising a computer program in the form of computer-executable components. The computer program/computer-executable components may be configured to cause a control unit 10, e.g. as discussed herein, to perform an embodiment of the method of the present disclosure. The computer program/computer-executable components may be run on the processor circuitry of the control unit 10 for causing it to perform the method. The computer program product may e.g. be comprised in a storage unit or memory comprised in the control unit 10 and associated with the processor circuitry. Alternatively, the computer program product may be, or be part of, a separate, e.g. mobile, storage means, such as a computer readable disc, e.g. CD or DVD or hard disc/drive, or a solid state storage medium, e.g. a RAM or Flash memory.

EXAMPLE

The logic to compensate flux error may in one embodiment be described as follows.

The flux error ($e_\psi$) is calculated S2 at the end of every half switching sample (i.e. $T_{sw}/2$). The flux error should go to zero, but it may not happen due to some practical considerations (e.g. ripple in the cell capacitor voltage, variation of reference voltage within $T_{sw}/2$).

Divide S3 the flux error ($e_\psi$) at the end of the half switching sample by the half switching sample duration $$\left(\frac{T_{sw}}{2}\right).$$

This will give the average voltage error ($U^{avg}_{error}$) that was not compensated in the previous half switching sample.

Subtract S4 this voltage error ($U_{error}^{avg}$) from the voltage reference ($U_{ref}$) of the next sample k. The idea is to compensate for the average voltage error created in the previous sample k-1 due to non-idealities in the coming sample.

To improve the performance of compensation the update can be performed at every simulation sample (e.g. 10 μs, i.e. the sampling rate of the control unit 10) rather than at the beginning of every half switching sample $$\left(\frac{T_{sw}}{2}\right).$$

Hence, the voltage error ($U^{avg}_{error}$) is calculated and subtracted from the voltage reference every simulation step. This involves the calculation of flux error at every simulation step and dividing it by the half switching sample duration $$\left(\frac{T_{sw}}{2}\right).$$

This is similar to using a moving window of $$\frac{T_{sw}}{2}$$

to calculate the average voltage error and updating it in the voltage reference every simulation step. By this method, all the lower order harmonics other than the carrier harmonics can be damped effectively.

With reference again to FIG. 5, the current controller 11 generates a reference voltage signal which is sampled ($u_{ref}^s$(k)) e.g. every 100 μs. The actual converter voltage ($U_0$(k)) is calculated every simulation step from the measured cell capacitor voltages and the switching state of the cell inside the valve control unit (VCU) which may be comprised in the control unit 10. The voltage error ($U_{error}$(k)) is computed S6 between actual converter voltage and the sampled reference voltage. The integration S7 of voltage error produces flux error ($\Psi_{error}$). The corresponding average voltage error over a period of $T_{sw}/2$ is calculated S3 through the expression of Error! Reference source not found.7.

$$U_{error}^{avg} = \frac{\psi_{error}}{\left(\frac{T_{sw}}{2}\right)} \quad \text{Equation 7}$$

The reference voltage is updated S4 according to Equation 8.

$$U_{ref}^{mod} = U_{ref}^s - U_{error}^{avg} \quad \text{Equation 8}$$

This modified reference voltage is sent to the PWM module 12 which performs the PSC for generating the PWM pulses.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A method for reducing lower order harmonics of a power converter, the method comprising, for each phase leg of the converter, the steps of:
   obtaining a voltage reference for the phase leg, wherein the phase leg has a plurality of cells;
   for a present sample, obtaining a flux error of the output voltage of the phase leg, wherein the obtaining of the flux error comprises:
     calculating a voltage error of the present sample by subtracting an obtained voltage reference for the phase leg for a preceding sample from an estimated voltage output of the phase leg for said preceding sample; and
     integrating the calculated voltage error over a sampling time period to obtain the flux error of the present sample;
   dividing the present sample flux error by a cycle time period to obtain an average voltage error over said time period;
   subtracting an obtained processed average voltage error, based on the average voltage error, from the voltage reference to obtain a modified voltage reference for the phase leg; and
   providing the modified voltage reference to a modulation unit of the converter for controlling the phase leg in a present cycle time period,
   generating, by the modulation unit, switching state signals to switch on or off of all of the cells in the phase leg using the modified voltage reference, thereby compensating for the average voltage error that is not compensated in the preceding sample to control the phase leg in the present cycle time period, and reducing the lower order harmonics of the phase leg.

2. The method of claim 1, wherein obtaining the processed average voltage error comprises multiplying the average voltage error by a gain.

3. The method of claim 2, wherein obtaining the processed average voltage error comprises applying a filter to the average voltage error.

4. The method of claim 2, wherein the cycle time period is the half switching cycle duration.

5. The method of claim 2, wherein sampling is performed every 10 μs or less.

6. The method of claim 1, wherein obtaining the processed average voltage error comprises applying a filter to the average voltage error.

7. The method of claim 6, wherein the cycle time period is the half switching cycle duration.

8. The method of claim 6, wherein sampling is performed every 10 μs or less.

9. The method of claim 1, wherein the cycle time period is the half switching cycle duration.

10. The method of claim 9, wherein sampling is performed every 10 μs or less.

11. The method of claim 1, wherein sampling is performed every 10 μs or less.

12. The method of claim 1, wherein the method is performed by a respective control unit of each phase leg.

13. The method of claim 1, wherein the modulation unit is for pulse-width modulation, PWM.

14. The method of claim 13, wherein the modulation unit is for phase shifted carrier based PWM.

15. A non-transitory computer program product comprising computer-executable components for causing a control unit for a phase leg of a power converter to perform the method of claim 1 when the computer-executable components are run on processor circuitry comprised in the control unit.

16. A control unit for a phase leg of a power converter, the control unit comprising:
   processor circuitry; and
   a storage unit storing instructions executable by said processor circuitry whereby said control unit is operative to:
     obtain a voltage reference for the phase leg, wherein the phase leg has a plurality of cells;

for a present sample, obtain a flux error of the output voltage of the phase leg by:
  calculating a voltage error of the present sample by subtracting an obtained voltage reference for the phase leg for a preceding sample from an estimated voltage output of the phase leg for said preceding sample; and
  integrating the calculated voltage error over a sampling time period to obtain the flux error of the present sample;
divide the present sample flux error by a time period to obtain an average voltage error over said time period;
subtract an obtained processed average voltage error, based on the average voltage error, from the voltage reference to obtain a modified voltage reference for the phase leg; and
provide the modified voltage reference to a modulation unit of the converter for controlling the phase leg in a present cycle time period, such that the modulation unit generates switching state signals to switch on or off of all of the cells in the phase leg using the modified voltage reference, thereby compensating for the average voltage error that is not compensated in the preceding sample to control the phase leg in the present cycle time period, and reducing the lower order harmonics of the phase leg.

17. A power converter comprising a plurality of phase legs, each of which comprising a control unit of claim 16.

18. The converter of claim 17, wherein the converter is a three-phase converter in delta configuration or Y configuration.

19. A non-transitory computer program product for reducing lower order harmonics of a power converter, the computer program product comprising computer program code which is able to, when run on processor circuitry of a control unit for a phase leg of the power converter, cause the control unit to:
  obtain a voltage reference for the phase leg, wherein the phase leg has a plurality of cells;
  for a present sample, obtain a flux error of the output voltage of the phase leg by:
    calculating a voltage error of the present sample by subtracting an obtained voltage reference for the phase leg for a preceding sample from an estimated voltage output of the phase leg for said preceding sample; and
    integrating the calculated voltage error over a sampling time period to obtain the flux error of the present sample;
  divide the present sample flux error by a time period to obtain an average voltage error over said time period;
  subtract an obtained processed average voltage error, based on the average voltage error, from the voltage reference to obtain a modified voltage reference for the phase leg; and
  provide the modified voltage reference to a modulation unit of the converter for controlling the phase leg in a present cycle time period, such that the modulation unit generates switching state signals to switch on or off of all of the cells in the phase leg using the modified voltage reference, thereby compensating for the average voltage error that is not compensated in the preceding sample to control the phase leg in the present cycle time period, and reducing the lower order harmonics of the phase leg.

20. The non-transitory computer program product according to claim 19, wherein the non-transitory computer program product is embodied on a non-transitory computer readable medium.

* * * * *